(12) United States Patent
Roozen et al.

(10) Patent No.: US 7,508,207 B2
(45) Date of Patent: Mar. 24, 2009

(54) MAGNETIC RESONANCE IMAGING DEVICE WITH SOUND-ABSORBING MEANS

(75) Inventors: Nicolaas Bernardus Roozen, Eindhoven (NL); Robert Paul Kleihorst, Eindhoven (NL); Cornelis Leonardus Gerardus Ham, Eindhoven (NL); Martijn Roger La Grange, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 70 days.

(21) Appl. No.: 10/557,757

(22) PCT Filed: May 17, 2004

(86) PCT No.: PCT/IB2004/050709

§ 371 (c)(1),
(2), (4) Date: Nov. 18, 2005

(87) PCT Pub. No.: WO2004/104614

PCT Pub. Date: Dec. 2, 2004

(65) Prior Publication Data

US 2006/0273793 A1    Dec. 7, 2006

(30) Foreign Application Priority Data

May 22, 2003    (EP)    ................... 03101467

(51) Int. Cl.
    *G01V 3/00*    (2006.01)
(52) U.S. Cl. ...................................... 324/318
(58) Field of Classification Search ......... 324/300–322; 600/410–435
    See application file for complete search history.

(56) References Cited

U.S. PATENT DOCUMENTS

| 4,774,486 A | | 9/1988 | Moritsu ....................... 335/299 |
| 5,084,676 A | * | 1/1992 | Saho et al. .................... 324/318 |
| 5,256,969 A | | 10/1993 | Miyajima et al. ........... 324/318 |
| 5,617,026 A | * | 4/1997 | Yoshino et al. .............. 324/318 |
| 6,043,653 A | | 3/2000 | Takamori et al. ............ 324/309 |
| 6,414,489 B1 | * | 7/2002 | Dean et al. ................... 324/318 |
| 6,597,174 B2 | * | 7/2003 | Arz .............................. 324/318 |

(Continued)

FOREIGN PATENT DOCUMENTS

DE    34 44388 A1    8/1985

(Continued)

OTHER PUBLICATIONS

Fuchs, H.V., et al.; Einsatz mikro-perforierter Platten als Schallabsorber mit inharenter Dampfung; 1995; Acustica, S. Hirzel Verlag, Stuttgart, DE; 81:107-116.

(Continued)

*Primary Examiner*—Brij B. Shrivastav
*Assistant Examiner*—Dixomara Vargas

(57) ABSTRACT

The invention provides a magnetic resonance imaging (MRI) device (21), comprising a diagnostic space (25), a main magnetic system (22) for generating a main magnetic field in said diagnostic space, a gradient magnetic coil system (23) comprising a gradient coil for generating at least one gradient of the main magnetic field, and noise reducing means (29, 32) for reducing noise that is generated as a result of vibrations of the gradient coil. The noise reducing means comprise a sound-absorbing panel (29) disposed between the gradient coil and the diagnostic space. The sound-absorbing panel (29) comprises channels having an open end and a closed end.

18 Claims, 4 Drawing Sheets

U.S. PATENT DOCUMENTS

| | | |
|---|---|---|
| 6,628,117 B2 * | 9/2003 | Ham .......................... 324/318 |
| 6,933,722 B2 * | 8/2005 | Tsuda et al. ................ 324/318 |
| 7,034,537 B2 * | 4/2006 | Tsuda et al. ................ 324/320 |
| 7,053,616 B2 * | 5/2006 | Roozen et al. .............. 324/318 |
| 7,053,744 B2 * | 5/2006 | Arz et al. .................... 335/299 |
| 7,068,033 B2 * | 6/2006 | Sellers et al. ............... 324/318 |
| 2003/0016018 A1 | 1/2003 | Arz ............................. 324/322 |
| 2007/0035297 A1 * | 2/2007 | Kitagawa .................... 324/309 |

FOREIGN PATENT DOCUMENTS

| | | |
|---|---|---|
| DE | 198 38 390 A1 | 3/2000 |
| EP | 0 522 742 A1 | 1/1993 |
| EP | 0 350 640 B1 | 2/1997 |
| FR | 2833278 A1 * | 6/2003 |
| JP | 62-239503 | 10/1987 |
| JP | 2002-85368 | 3/2002 |

OTHER PUBLICATIONS

Yoda, M., et al.; Tunable Acoustic Absorber with Micro Deep Hole Array; 1998; International Symposium on Micromechatronics and Human Science; p. 177-182.

* cited by examiner

MAGNETIC RESONANCE IMAGING DEVICE WITH SOUND-ABSORBING MEANS

The invention relates to a magnetic resonance imaging (MRI) device, comprising a diagnostic space, a main magnetic system for generating a main magnetic field in said diagnostic space, a gradient magnetic coil system comprising a gradient coil for generating at least one gradient of the main magnetic field, and noise reducing means for reducing noise that is generated as a result of vibrations of the gradient coil.

A magnetic resonance imaging (MRI) device of the kind mentioned in the opening paragraph is known in a substantially cylindrical embodiment thereof, which is also referred to as the closed type. An example thereof is disclosed in U.S. Pat. No. 6,043,653. In the case of closed-type MRI devices, an asymmetrical arrangement may be used, seen in the direction of rotation, in which the device has a strongly flattened underside or an oval cross-section, for example.

Besides that, we have lately witnessed a growing interest in the open variant, which comprises two substantially disc-shaped housings, each accommodating part of the main magnetic system and part of the gradient magnetic system. The diagnostic space is positioned between the disc-shaped housings, where a vertically oriented magnetic field is generated. An open-type MRI system has a few significant advantages over the closed-type MRI system, which advantages are connected with the fact that more free space is available round the patient in the diagnostic space. On the one hand this helps to alleviate any claustrophobic feelings that the patient may have, whilst on the other hand the larger amount of space makes it possible or easier for medical staff to perform medical actions on the patient in the diagnostic space.

An important problem that is encountered in practice are the acoustic vibrations produced by the MRI system. Said acoustic vibrations produce noise, which is unpleasant for the patient who is to be examined in the diagnostic space. The acoustic vibrations are caused by the fact that relatively high Lorentz forces act on the electrical windings of the gradient coil as a result of electro-mechanical interaction between the alternating current being passed through the electrical windings of the gradient coil at frequencies of up to about 4000 Hz and the strong magnetic field generated by the main magnet. Said interaction causes mechanical vibrations in the construction of the MRI system, more specifically in the gradient coil thereof which in turn lead to the occurrence of said acoustic vibrations both in the diagnostic space and outside the MRI system, precisely in the frequency range of up to 4000 Hz in which a person's sense of hearing is acutest.

The aforesaid U.S. Pat. No. 6,043,653 proposes a solution for the noise problem, according to which the gradient coil windings as a whole are accommodated in a vacuum chamber. This makes heavy constructional demands on the MRI device in question, which leads to a significant increase in the cost price thereof.

An object of the invention is to provide a magnetic resonance imaging (MRI) device of the kind mentioned in the opening paragraph with a reduced noise level in a relatively simple and thus relatively inexpensive manner.

In order to achieve this object, a magnetic resonance imaging (MRI) device according to the invention is characterized in that the noise reducing means comprise a sound-absorbing panel disposed between the gradient coil and the diagnostic space. Thus, a substantial noise reduction can be achieved in a constructionally simple manner which, unlike the solution proposed in the aforesaid U.S. Pat. No. 6,043,653, which attempts to prevent sound being produced, prevents sound from being reflected by absorbing said sound by means of the sound-absorbing panel that its disposed precisely at the location where its effect will be greatest.

A noticeable noise reduction is already obtained if the sound-absorbing panel has an absorption coefficient in the order of at least 0.5, more preferably in the order of at least 0.75 for at least part of the frequency range between 20 Hz and 4000 Hz. The sound absorption coefficient indicates the proportion between absorbed sound (in dB) and incoming sound (in dB). If the absorption coefficient is 1, this implies, therefore, that the sound-absorbing panel absorbs all the incoming sound. A sound absorption coefficient value of 0.5 will result in a noise reduction of 1.3 dB. In general, the following applies as regards the sound pressure SPL (in Pa) as a function of the time t:

$$SPL(t) = A^*[\sin(2\pi^* f^* t) + \sqrt{(1-\alpha)}^* \sin(2\pi^* f^* t)]$$

wherein A is the amplitude of a sound wave (in Pa), f is the frequency, and (z is the absorption coefficient.

A very suitable embodiment of a magnetic resonance imaging device according to the invention is obtained if the sound-absorbing panel comprises channels having an open end and a closed end, which channels preferably extend at least substantially in a direction parallel to the direction between the diagnostic space and the gradient coil. The channels' function is to effect a certain degree of sound absorption by the panels. An important advantage of the use of channels is that a suitable selection of the dimensions of said channels makes it possible to optimize the sound-absorbing effect for the specific eigenfrequency of the gradient coil in the audible range.

Dependent on the available space for the required channels and the required length thereof, it might be advantageous if the channels extend at least substantially perpendicularly to the direction between the diagnostic space and the gradient coil, at least on the side of their closed ends.

The open ends of at least some of the channels are preferably present on the side of the associated channels that faces the diagnostic space. Thus, sound coming from the diagnostic space will be absorbed.

Alternatively, but in particular in combination with the preferred embodiment as mentioned above, it is also quite possible within the framework of the invention for the open ends of at least some of the channels to be present on the side of the associated channels that faces towards the gradient coil. Thus, the open ends are directed towards the source of the noise, so that a very advantageous noise reducing effect is obtained. If channels having their open ends on the side facing towards the diagnostic space as well as channels having their open ends on the side facing towards the gradient coil are used, it is possible, of course, to adapt the proportion between such channels to the production of noise associated with a specific MRI device.

As already said before, a suitable dimensioning of the channels makes it possible to optimally adapt the sound-absorbing effect thereof to the eigenfrequencies that occur. In general it can be stated, however, that the degree of sound absorption increases as the cross dimensions of the channels on the side of the associated open ends decrease. Consequently, the cross dimension of at least a part of the channels on the side of the associated open ends is preferably maximally 15 mm, more preferably maximally 10 mm. In the case of a channel in the form of a cylindrical bore, the term cross dimension refers to the diameter, of course. Although it is not necessary within the framework of the invention for the channels to be substantially cylindrical, a cylindrical shape is the most advantageous shape from a manufacturing viewpoint.

According to a very advantageous preferred embodiment, a cross dimension of a part of the channels on the side of the associated closed ends thereof is different from a cross dimension of the part of the channels on the side of the associated open ends. Thus, relatively short lengths of the associated channels provide a relatively great sound-absorbing effect. This is a major advantage in particular in the case of MRI equipment, since space is usually not available, or it can only be made available at major cost.

Preferably, the cross dimension of the part of the channels on the side of the associated closed ends is larger than a cross dimension of the part of the channels present on the side of the associated open ends. Channels configured in this manner, in which sound travels from a relatively small passage to a wider space at the end of the channel, appear to be very effective in absorbing sound without a great length of the channels being required.

In order to achieve a maximum utilization of the sound-absorbing effect, the proportion between the cross dimension of the part of the channels on the side of the associated closed ends and the cross dimension of the part of the channels on the side of the associated open ends is preferably in the order of 2.5, more preferably at least in the order of 4.0.

The sound-absorbing effect can be further enhanced by realizing a high density of sound-absorbing channels. Within this framework, the minimum spacing between adjacent channels at the location of the associated maximum cross dimension of the adjacent channels is preferably maximally 50% of the sum of the associated maximum cross dimensions, more preferably maximally 35% of the sum of the associated maximum cross dimensions. This implies, for example, that the spacing between two adjacent channels having a maximum diameter of 100 mm and 60 mm, respectively, is preferably maximally 80 mm, more preferably maximally 56 mm.

The above example perfectly illustrates that it is not necessary within the framework of the invention for the channels of the sound-absorbing panel to have mutually corresponding dimensions. On the contrary, it will generally be advantageous to use mutually different dimensions for the channels, since this makes it possible to optimally adapt the sound-absorbing effect of the channels to the various eigenfrequencies in the audible range of the gradient coil. Consequently, a very advantageous embodiment of the invention is characterized in that the dimensions of the channels of the sound-absorbing panel are mutually different.

In order to limit the additional amount of space taken up as a result of the use of the sound-absorbing panel comprising the channels as much as possible, or even prevent this altogether, it is furthermore quite preferable to provide the sound-absorbing panel with a radio frequency transmission coil system for generating and/or receiving a radio frequency signal in the diagnostic space. The function and the necessity of a radio frequency transmission coil system in an MRI device is known to those skilled in the art, and thus requires no further explanation herein. It suffices to say that the radio frequency transmission coil system is usually present between the gradient coil and the diagnostic space. The exact embodiment of the radio frequency transmission coil system is not of primary interest within the framework of the present preferred embodiment of the invention. The radio frequency coil of the radio frequency transmission coil system may be symmetrical or asymmetrical, for example, it may or may not be provided with shoulder recesses, or it may only be present on one side of the MRI device, for example.

Preferably, the radio frequency transmission coil system comprises an electrically conductive winding which extends at least in part between at least some of the channels. Furthermore preferably, such an electrically conductive winding extends in full between at least some of the channels. In practice, this preferred embodiment will be used in particular with closed-type MRI devices, in which the radio frequency transmission coil system comprises electrically conductive windings.

In the case of open-type MRI devices, the radio frequency transmission coil system in general comprises an electrically conductive layer arranged on a plate-shaped carrier of a resinous material. Such a carrier can be advantageously provided with sound-absorbing channels, so that the carrier can be regarded as the sound-absorbing panel within the framework of the present invention. Preferably, the radio frequency transmission coil system therefore comprises at least one electrically conductive layer, with which the sound-absorbing panel is coated on the side of the diagnostic space and in which openings are present at the location of any open ends of the channels that may be present on the side of the diagnostic space. Said openings in the electrically conductive layer guarantee the open character of one end of the channels. The open ends of the channels being used may all be present on the side of the gradient coil, of course, in which situation it is therefore not necessary to provide the electrically conductive layer with openings.

In particular if it is decided to have the cross dimensions of the channels change in leaps, seen in the longitudinal direction thereof, it is preferable for manufacturing reasons to build up the sound-absorbing panel of a number of abutting, preferably glued-together subpanels.

A further improvement as regards the sound absorbing or noise reducing effect is obtained if, in accordance with a preferred embodiment, the sound-absorbing panel is coated between the open ends with a sound-absorbing material having an absorption coefficient of at least 0.5 for at least part of the frequency range between 20 Hz and 4000 Hz.

In an alternative embodiment of the sound-absorbing panel, said panel comprises glass wool. The use of glass wool is in particular advantageous in the frequency range between 2000 Hz and 10.000 Hz.

The invention will be explained in more detail hereinafter by means of a description of a number of preferred embodiments of the invention. In the description, reference will be made to the following Figs., in which:

FIG. 3b is a front elevation of a radio frequency transmission coil unit as used in the MRI device according to FIG. 3a;

FIG. 3c shows the detail if IIIc in FIG. 3a; and

Figure 1:
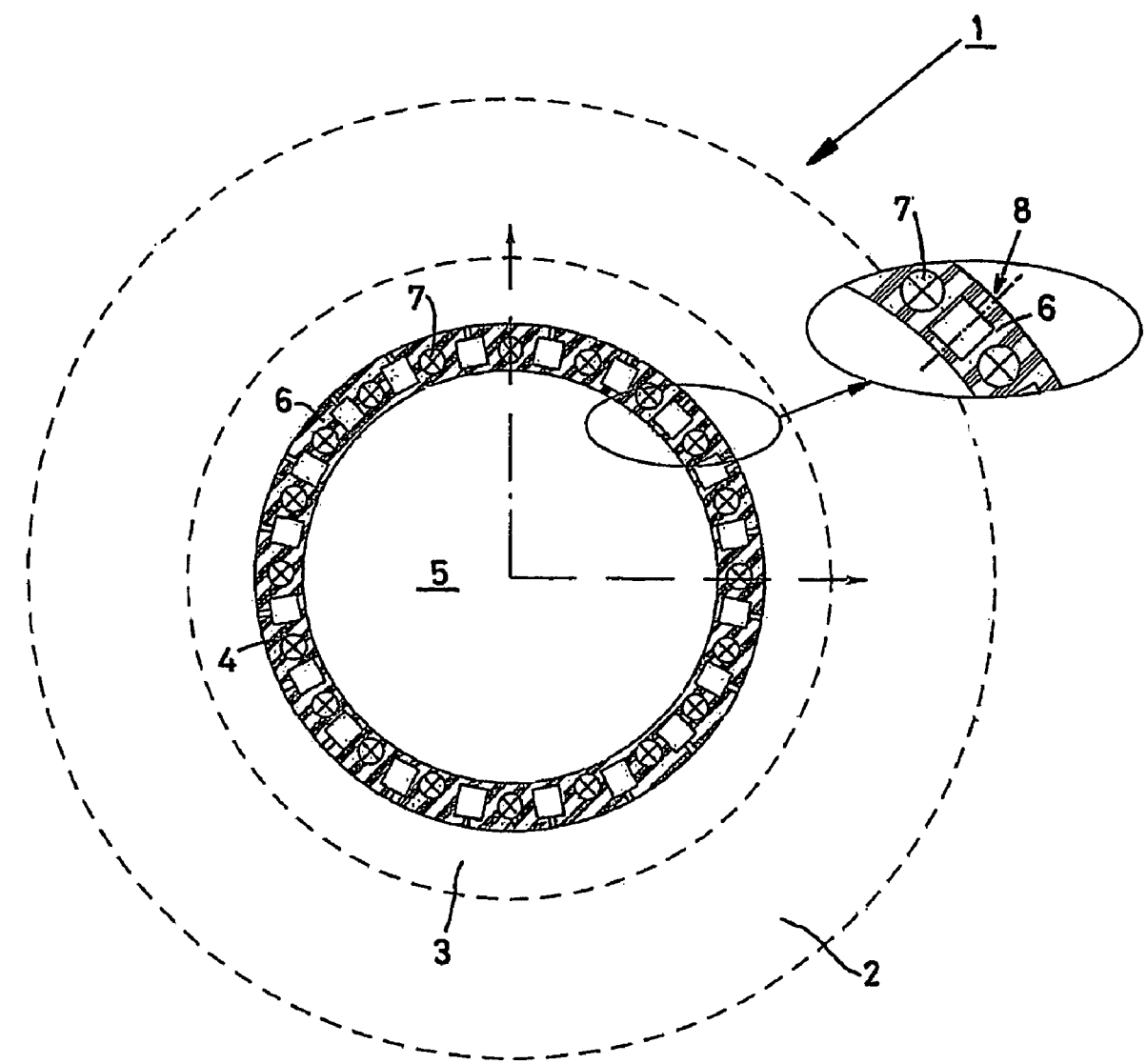
FIG. 1 is a schematic, vertical cross-sectional view of a first embodiment of a (closed-type) MRI device according to the invention.

FIG. 1 schematically shows in a vertical cross-sectional view the structure of an MRI device 1 according to the invention. A cylindrical, main magnetic system 2 is shown to form the outermost shell. Said cylindrical main magnetic system 2 comprises superconducting magnets, which are maintained at a low temperature, using a cryostat, such that said magnets will exhibit their superconducting characteristics. Present within the main magnetic system 2 is a cylindrical gradient coil system 3. A cylindrical radio frequency transmission coil system 4, a few details of which are schematically shown in FIG. 1, is in turn present within the gradient coil system 3. Finally, the diagnostic space 5, in which the patient lies on a support (not shown), is present within the substantially cylindrical radio frequency transmission coil system. Such a structure of a closed-type MRI device is known to those skilled in the art. An illustrative example of this is the aforesaid U.S. Pat. No. 6,043,653, for example. Consequently, a brief explanation of the structure of the MRI device 1 will suffice within the framework of the present invention.

The main magnetic system 2 generates a main magnetic field in the diagnostic space 5. Within the framework of the present invention it suffices to mention that it is possible, using the main magnetic system 2, the gradient coil system 3 and the radio frequency transmission coil system 4, to generate images of internal parts of a patient who is present in the diagnostic space 5. Said generation of images may involve very large electromagnetic forces, which cause vibrations of the gradient coil system 3. Said vibrations have a frequency within the audible range of humans, in particular in the frequency range between 20 Hz and 4000 Hz, and they constitute a substantial, unpleasant acoustic burden, at least in principle, for a patient who is present in the diagnostic space 5.

The cylindrical radio frequency transmission coil system 4 is substantially made up of a tubular shell of a solid resinous material 6. Embedded in said resinous material are electrically conductive windings 7. The windings 7 extend substantially in the axial direction. Present between the windings 7 are radially extending cylindrical bores 8, which are open at the ends facing the cylindrical gradient coil system 3 and which are closed at the opposite ends. The length of the bores 8 is less than the thickness of the wall of resinous material 6 of the radio frequency transmission coil system 4. The bore has a relatively small diameter in the order of 20 mm on the side of the open end, whereas the diameter on the side of the closed end is about 100 mm. An abrupt diameter leap occurs between the two parts of the bores 8 that have different diameters.

It has been established by experiment that bores 8 have an absorbing effect on sound from the gradient coil system 3. The dimensions of the bores 8 determine for which frequencies the sound-absorbing effect occurs in particular, so that the sound-absorbing effect can be optimized for the eigenfrequencies of the gradient coil system 3, insofar as they fall within the audible range, by suitably selecting the dimensions of the bores 8 (the diameters and the individual lengths of parts having a particular diameter).

Figure 2:
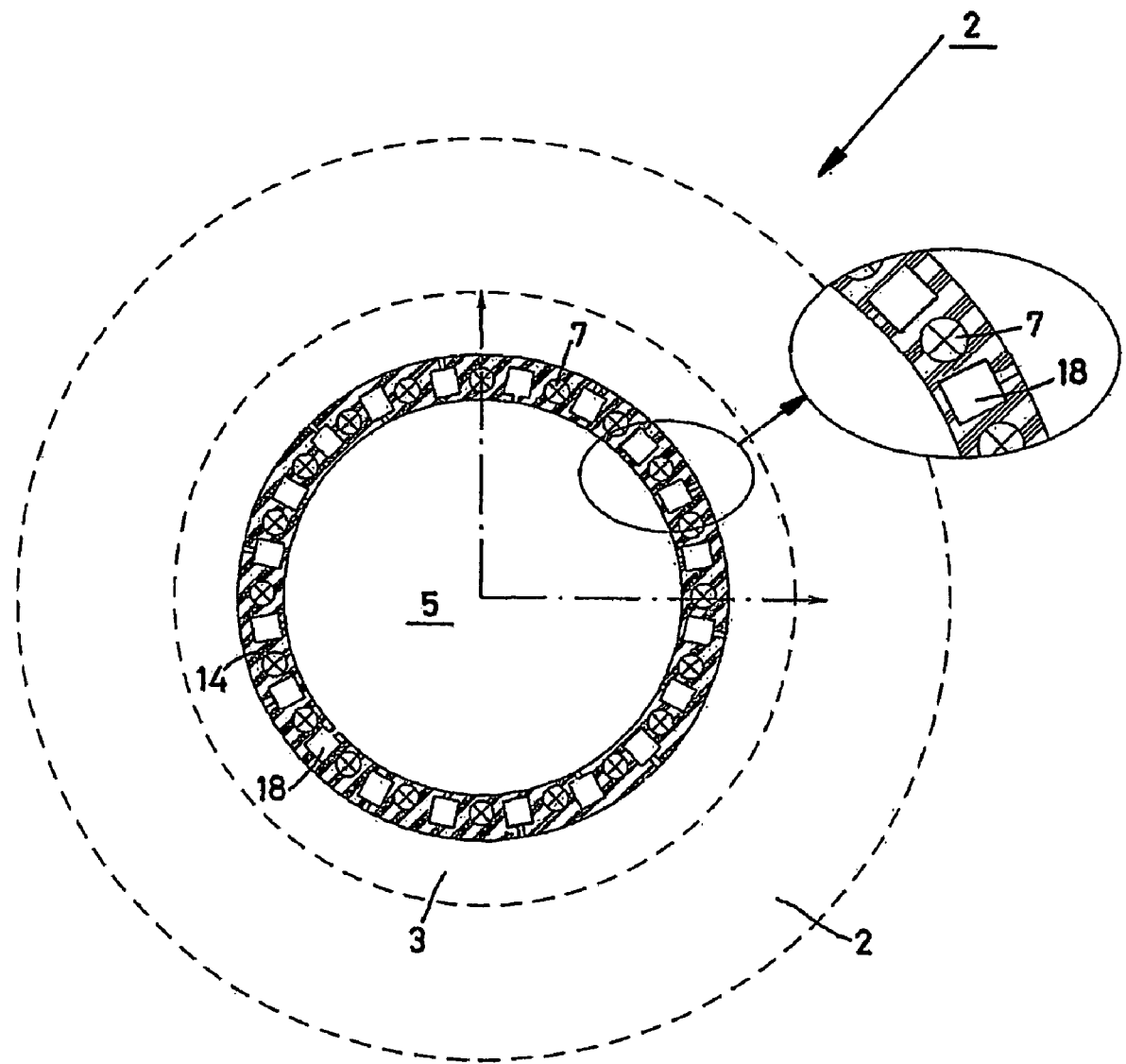
FIG. 2 is a schematic, vertical cross-sectional view of a second embodiment of a (closed-type) MRI device according to the invention.

FIG. 2 shows a cross-sectional view similar to FIG. 1, with this difference that FIG. 2 shows a MRI device 11 whose only difference from the MRI device 1 relates to the embodiment of the radio frequency transmission coil system 14. More specifically, the two embodiments differ from each other as regards the orientation of the bores 18 of the radio frequency transmission coil system 14, whose open ends are not exclusively present on the side of the cylindrical gradient coil system 3, but alternately on the side of the cylindrical coil system 3 and on the side of the diagnostic space 5. The bores 18 have identical dimensions, although this is not necessary within the framework of the invention. Since the open ends are present on either side (seen in radial direction) of the radio frequency transmission coil system 14, the sound-absorbing effect occurs for sound coming from the direction of the cylindrical gradient coil system 3 as well as for sound coming from the direction of the diagnostic space 5.

Figure 3A:
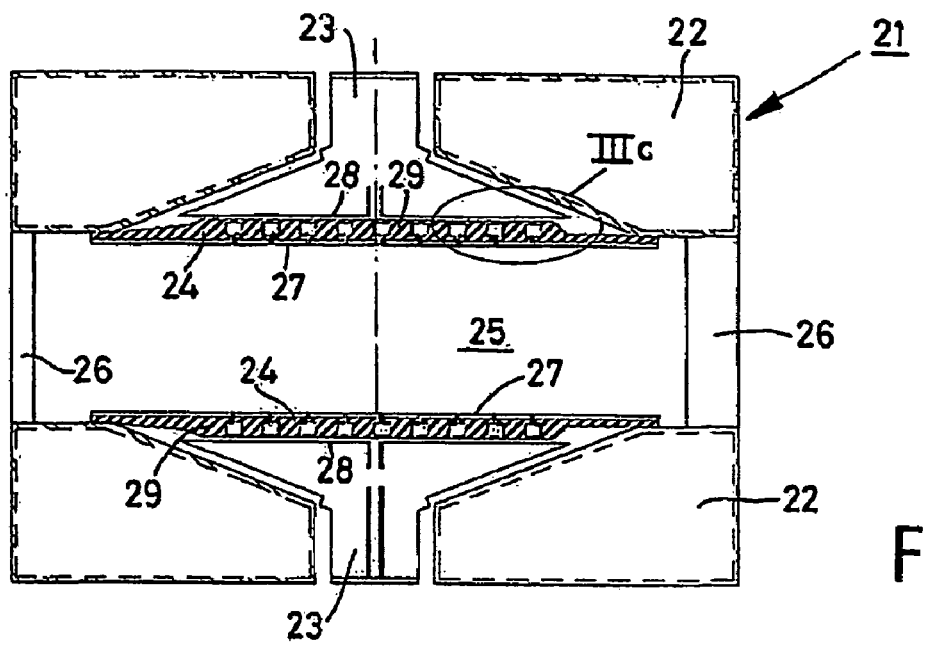
FIG. 3a is a schematic, vertical cross-sectional view of a third embodiment of a (closed-type) MRI device according to the invention.

FIG. 3a schematically shows in a cross-sectional view a MRI device 21 according to the invention. The MRI device 21 is of the open type. Although it is of different design than a close-type MRI device, the open-type MRI device 21 comprises the same main components as a closed-type MRI device, viz. a main magnetic system 22, a gradient coil system 23 and a radio frequency transmission coil system 24. The systems 22, 23, 24 are mainly made in two parts disposed on either side of a diagnostic space 25. The parts of the systems 22, 23, 24 present at the bottom side of the diagnostic space 25 are accommodated in a substantially disc-shaped lower housing (not shown), whilst the parts of the systems 22, 23, 24 present at the upper side of the diagnostic space are accommodated in a substantially disc-shaped upper housing (not shown). The lower housing and the upper housing are interconnected by means of uprights 26. A more detailed description of an open-type MRI device is not necessary herein, in the first place because open-type MRI devices are generally known to those skilled in the art and in the second place because no further explanation is required for understanding the invention.

The radio frequency transmission coil system 24 comprises two substantially disc-shaped, more or less solid plates 29 of a resinous material, which are disposed on either side of the diagnostic space 25. Within the framework of the invention it is not important for the preferred embodiment, in which sound absorbing bores are formed in the radio frequency transmission coil system, whether said plates are solid or made of a resinous material. Alternatively it is possible, for example, to use polycarbonate, which does not necessarily have to be solid. The windings 7 as used in the MRI devices 1 and 11 according to FIGS. 1 and 2, respectively, have been substituted for electrically conductive plates 27 on the side of the diagnostic space 25. An electrically conductive plate 28 is also present on the side of system parts of the radio frequency transmission coil system 24 remote from the diagnostic space 25, which electrically conductive plate is significantly less thick than the electrically conductive plates 27, however.

Present between the two electrically conductive plates 27, 28 is a carrier plate 29 of a resinous material which is built up of two glued-together subplates 30, 31. Bores 32 having an open end on the side of the diagnostic space 25 and an opposite closed end are formed in the carrier plates 29. The diameter of the bore 32 extending within the thickness of the subplate 31 is smaller than the diameter of the bore 32 extending within the thickness of the subplate 30. Consequently, a diameter leap occurs within the length of the bore 32 at the location of the transition between the subplates 30 and 31, which is advantageous for understandable manufacturing reasons. At the location of the open ends of the bores 32, the electrically conductive plate 27 is likewise provided with openings having a diameter corresponding to that of the bore 32 extending within the subplate 31.

As already said forth above, the presence of the bores 32 provides a sound-absorbing effect, in this case for sound coming from the diagnostic space 25. Alternatively, as a person skilled in the art will understand, the open ends of the bores 32 may be directed towards an associated part of the gradient coil system 23, or alternately towards the associated part of the gradient coil system 23 and towards the diagnostic space 25, more or less similar to the situation of the MRI device 11 according to FIG. 2.

Figure 3B:
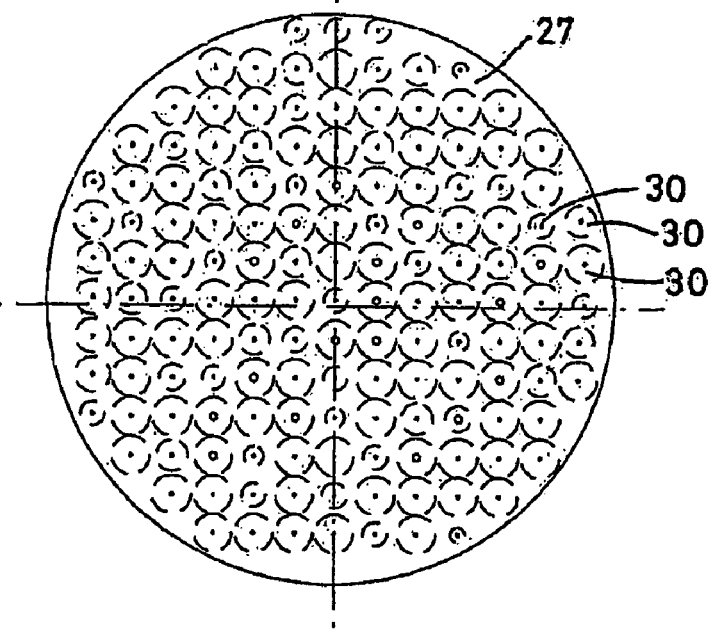
Figure 3C:
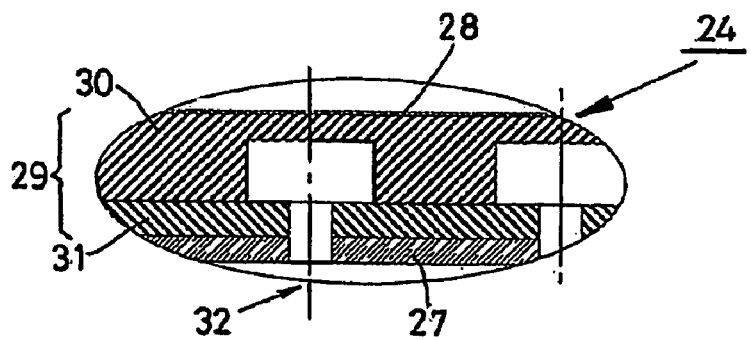

FIG. 3b is a clear schematic view of the manner in which the bores are distributed over the area of the system parts of the radio frequency coil system 24. Although this is not essential to the invention, it has been opted to use a constant centre-to centre distance between the various bores 30. In explanation thereof it is noted that the large diameters (not shown) on the side of the closed ends of the bores 30 are illustrated in dotted lines in FIG. 3. As the figure shows, the bores 30 are different from each other as regards the dimension of the diameters at the location of the open ends and the closed ends. Thus, the bores and the sound-absorbing effects thereof can be optimally adapted to the various eigenfrequencies that occur in the gradient coil system 23. Besides the diameters of the various parts, also the length of said parts, can be varied.

Figure 4A:
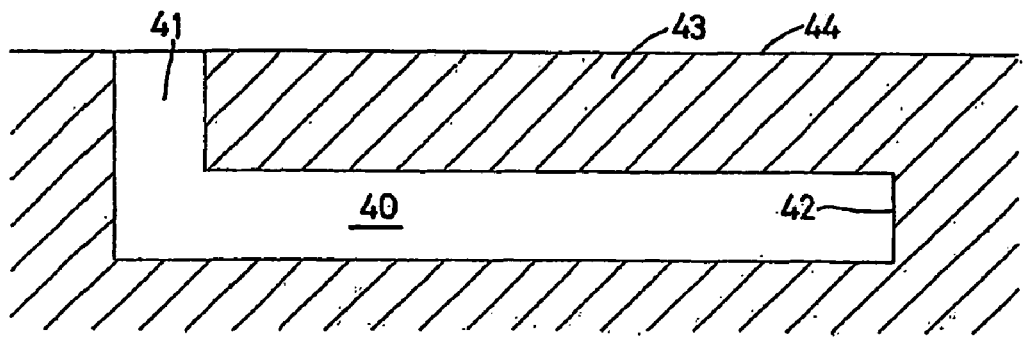
FIGS. 4a-4c shows three alternative embodiments of sound-absorbing channels that may be used in preferred embodiments of the present invention.
Figure 4B:
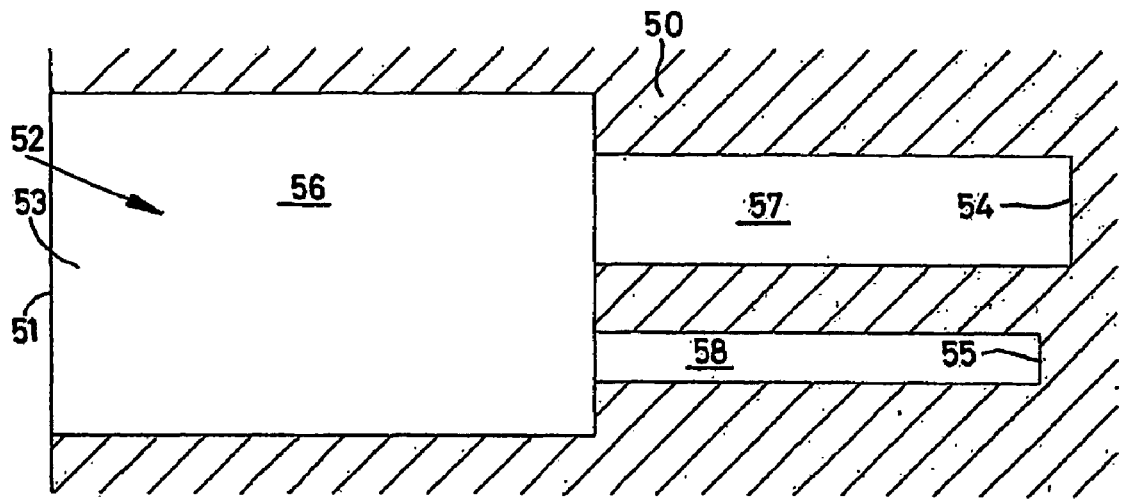
Figure 4C:
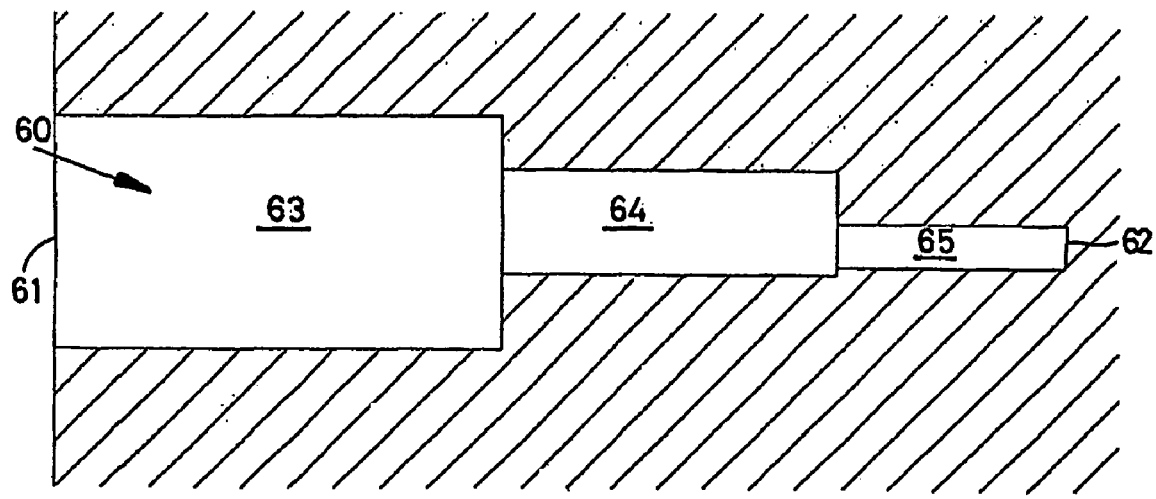

FIGS. 4a-4c show alternative embodiments of sound-absorbing channels that may be used in a sound-absorbing panel that forms part of a MRI device according to the present invention. The channel 40 that is shown in FIG. 4a extends between an open end 41 and a closed end 42 within a sound-absorbing panel 43 having a free surface 44. The channel 40, which has a circular cross-section, comprises a right angle between the two ends 41 and 42, so that part of the necessary length of the channel 40, which is not available within the sound-absorbing panel 43 in a direction perpendicular to the free surface 44, is created in a direction parallel to the free surface 44.

The sound-absorbing panel 50 having a free surface 51 as shown in FIG. 4b comprises a sound-absorbing channel 52 having one open end 53 and two closed ends 54, 55. On the side of the open end 53, the channel 52 comprises a single cylindrical space 56, which branches into cylindrical spaces 57, 58 of mutually different diameter and length on the side of the closed ends 54 and 55, respectively. The sound absorbing channel 52 can be geared to the attenuation of specific frequencies by varying the dimensions of the spaces 56, 57, 58.

The diameter of the sound-absorbing channel 60 according to FIG. 4c increases in steps from the open end 61 to the closed end 62 thereof, so that three parts 63, 64, 65 having different diameters are formed.

Although the invention has been explained in the above on the basis of the use of bores for obtaining a sound-absorbing effect, it is also possible within the framework of the invention to use sound-absorbing materials, such as glass wool. Also a combination is possible, in which the sound-absorbing material, such as glass wool, is provided around the open ends of the various bores.

The invention claimed is:

1. A magnetic resonance imaging (MRI) device comprising:
a diagnostic space,
a main magnetic system for generating a main magnetic field in said diagnostic space,
a gradient magnetic coil system comprising a gradient coil for generating at least one gradient of the main magnetic field, and noise reducing means for reducing noise that is generated as a result of vibrations of the gradient coil, wherein the noise reducing means comprise a sound-absorbing panel disposed between the gradient coil and the diagnostic space wherein the sound-absorbing panel comprises channels having an open end and a closed end, wherein at least one of:
the channels extend at least substantially perpendicularly to the direction between the diagnostic space and the gradient coil, at least on the side of their closed ends;
a cross dimension of at least a part of the channels on the side of the associated open ends is maximally 15 mm, preferably maximally 10 mm;
minimum spacing between adjacent channels at the location of the associated maximum cross dimension of the adjacent channels is maximally 50% of the sum of the associated maximum cross dimensions, preferably maximally 35% of the sum of the associated maximum cross dimensions;
dimensions of the channels of the sound-absorbing panel are mutually different;
the sound absorbing panel is built up of a number of abutting, preferably glued-together subpanels; or
the sound-absorbing panel is coated between the open ends with a sound-absorbing material having an absorption coefficient of at least 0.5 for at least part of the frequency range between 20 Hz and 4000 Hz.

2. The magnetic resonance imaging (MRI) device according to claim 1, wherein the sound-absorbing panel has an absorption coefficient in the order of at least 0.5, more preferably in the order of at least 0.75 dB for at least part of the frequency range between 20 Hz and 4000 Hz.

3. A magnetic resonance imaging (MRI) device comprising:
a diagnostic space,
a main magnetic system for generating a main magnetic field in said diagnostic space;
a gradient magnetic coil system comprising:
a gradient coil for generating at least one gradient of the main magnetic field, and a sound-absorbing panel disposed between the gradient coil and the diagnostic space to reduce noise reducing means for reducing noise that is generated as a result of vibrations of the gradient coil, the sound-absorbing panel including channels having an open end and a closed end, wherein the open ends of at least some of the channels are present on a side of the associated channels that faces, towards the diagnostic space or on a side of the associated channels that faces towards the gradient coil.

4. The magnetic resonance imaging (MRI) device according to claim 3, wherein said channels extend at least substantially in a direction parallel to the direction between the diagnostic space and the gradient coil.

5. The magnetic resonance imaging (MRI) device according to claim 3, wherein the cross dimension of at least a part of the channels on the side of the associated open ends is maximally 15 mm, preferably maximally 10 mm.

6. The magnetic resonance imaging (MRI) device according to claim 3, wherein a minimum spacing between adjacent channels at a location of an associated maximum cross dimension of the adjacent channels is maximally 50% of a sum of the associated maximum cross dimensions.

7. The magnetic resonance imaging (MRI) device according to claim 3, wherein dimensions of the channels of the sound-absorbing panel are mutually different.

8. The magnetic resonance imaging (MRI) device according to claim 3, wherein the sound-absorbing panel is built up of a number of abutting subpanels.

9. The magnetic resonance imaging (MRI) device according to claim 3, wherein the sound-absorbing panel is coated between the open ends with a sound-absorbing material having an absorption coefficient of at least 0.5 for at least part of the frequency range between 20 Hz and 4000 Hz.

10. The magnetic resonance imaging (MRI) device according to claim 3, wherein the open ends of some of the channels face the diagnostic imaging space and the open ends of the other channels face the gradient coil.

11. A magnetic resonance imaging (MRI) device comprising:
a diagnostic space;
a main magnetic system for generating a main magnetic field in said diagnostic space;
a gradient magnetic coil system including:
a gradient coil for generating at least one gradient of the main magnetic field, and a sound-absorbing panel disposed between the gradient coil and the diagnostic space, the sound-absorbing panel including channels having an open end and a closed end, a cross dimension of at least a part of the channels on a side of the associated closed ends thereof being different from a cross dimension of a part of the channels on the side of the associated open ends.

12. The magnetic resonance imaging (MRI) device according to claim 11, wherein the open ends of at least some of the channels are present on the side of the associated channels that faces towards the gradient coil.

13. The magnetic resonance imaging (MRI) device according to claim 11, wherein the cross dimension of the part of the channels on the side of the associated closed ends is larger than a cross dimension of the part of the channels present on the side of the associated open ends.

14. The magnetic resonance imaging (MRI) device according to claim 13, wherein a proportion between the cross dimension of the part of the channels on a side of the associated closed ends and the cross dimension of the part of the channels on the side of the associated open ends is at least in the order of 2.5.

15. The magnetic resonance imaging (MRI) device according to claim 13, wherein a proportion between the cross dimension of the part of the channels on the side of the associated closed ends and the cross dimension of the part of the channels on the side of the associated open ends is at least 4.0.

16. A magnetic resonance imaging (MRI) device comprising:
a diagnostic space;
a main magnetic system for generating a main magnetic field in said diagnostic space;
a gradient magnetic coil system including;
a gradient coil for generating at least one gradient of the main magnetic field, and
a sound-absorbing panel disposed between the gradient coil and the diagnostic space to reduce noise that is generated as a result of vibrations of the gradient coil, the sound-absorbing panel including channels having an open end and a closed end, the sound-absorbing panel being provided with a radio frequency transmission coil system for generating and/or receiving a radio frequency signal in the diagnostic space.

17. The magnetic resonance imaging (MRI) device according to claim 16, wherein the radio frequency transmission coil system includes an electrically conductive winding which extends at least in part between at least some of the channels.

18. The magnetic resonance imaging (MRI) device according to claim 16, wherein the radio frequency transmission coil system includes at least one electrically conductive layer, with which the sound-absorbing panel is coated on a side facing the diagnostic space and in which openings are present at a location of any open ends of the channels that may be present on the side facing the diagnostic space.

* * * * *